US012690391B2

(12) United States Patent
Kanai et al.

(10) Patent No.: US 12,690,391 B2
(45) Date of Patent: Jul. 21, 2026

(54) METHOD FOR MANUFACTURING DEVICE

(71) Applicant: SEIKO EPSON CORPORATION,
Tokyo (JP)

(72) Inventors: Toshiki Kanai, Shiojiri (JP); **Kenichi
Kurokawa, Suwa (JP); Yukio
Yamauchi**, Chino (JP)

(73) Assignee: SEIKO EPSON CORPORATION (JP)

( * ) Notice: Subject to any disclaimer, the term of this
patent is extended or adjusted under 35
U.S.C. 154(b) by 210 days.

(21) Appl. No.: 18/473,362

(22) Filed: Sep. 25, 2023

(65) Prior Publication Data

US 2024/0107887 A1     Mar. 28, 2024

(30) Foreign Application Priority Data

Sep. 26, 2022     (JP) ................................. 2022-152238

(51) Int. Cl.
*H10N 30/06*          (2023.01)
*H10N 30/02*          (2023.01)

(52) U.S. Cl.
CPC ............. *H10N 30/06* (2023.02); *H10N 30/02*
(2023.02)

(58) Field of Classification Search
CPC ......... H01L 21/32134; H01L 21/32132; H01L
21/31144; B81C 2201/013
See application file for complete search history.

(56) References Cited

U.S. PATENT DOCUMENTS

2012/0194283 A1 *   8/2012   Funakawa .............. H03H 9/215
310/363
2018/0148318 A1     5/2018   Flynn et al.

2018/0312395 A1     11/2018   Yamazaki et al.
2020/0067484 A1     2/2020   Yamazaki et al.
2020/0220514 A1 *   7/2020   Kim ...................... H10N 30/06

FOREIGN PATENT DOCUMENTS

EP          1736804       * 12/2006
JP          2018-195687 A    12/2018
JP          2018-201184 A    12/2018
JP          2018-201185 A    12/2018
JP          2020-036063 A     3/2020

OTHER PUBLICATIONS

Gomez_EP1736804 (Year: 2005).*

* cited by examiner

*Primary Examiner* — Thomas T Pham
(74) *Attorney, Agent, or Firm* — Harness, Dickey &
Pierce, P.L.C.

(57)          ABSTRACT

A method for manufacturing a device including an active
layer and a support substrate bonded to the active layer on
one surface side, the active layer including an element, an
electrode configured to drive the element, a frame portion
disposed around the element, and an electrode pad disposed
in the frame portion and coupled to the electrode, the method
including: forming a protective film at the other surface side
of the frame portion and the other surface side of the
element, the protective film being resistant to an etchant and
including a first opening portion formed between an outer
shape of the element and the frame portion and a second
opening portion formed on the electrode pad; and forming a
space between the element and the support substrate by
etching the support substrate with the etchant passing
through the first opening portion.

4 Claims, 8 Drawing Sheets

METHOD FOR MANUFACTURING DEVICE

The present application is based on, and claims priority from JP Application Serial Number 2022-152238, filed Sep. 26, 2022, the disclosure of which is hereby incorporated by reference herein in its entirety.

BACKGROUND

1. Technical Field

The present disclosure relates to a method for manufacturing a device.

2. Related Art

JP-A-2020-36063 discloses a method for manufacturing a vibration device, in which in order to form the vibration device, wet etching is performed using a silicon oxide film formed on a vibrating portion or on an electrode pad as a mask, a cavity (hollow) is formed below the vibrating portion, and then the wet etching is further performed to expose a surface of the electrode pad in order to remove the silicon oxide film on the electrode pad.

However, in the technique described in JP-A-2020-36063, when the silicon oxide film on the electrode pad is removed, the silicon oxide film disposed around the vibrating portion and used for correcting a resonance frequency is also removed, resulting in an increase in variation in a resonance frequency of a vibration element.

SUMMARY

A method for manufacturing a device is a method for manufacturing a device including an active layer and a support substrate bonded to the active layer on one surface side, the active layer including an element, an electrode configured to drive the element, a frame portion disposed around the element, and an electrode pad disposed in the frame portion and coupled to the electrode, and the method includes: forming a protective film at the other surface side of the frame portion and the other surface side of the element, the protective film being resistant to an etchant and including a first opening portion formed between an outer shape of the element and the frame portion and a second opening portion formed on the electrode pad; and forming a space between the element and the support substrate by etching the support substrate with the etchant passing through the first opening portion.

BRIEF DESCRIPTION OF THE DRAWINGS

FIG. 2 is a cross-sectional view taken along a line A-A of the vibration device shown in FIG. 1.

FIG. 7 is a cross-sectional view showing the method for manufacturing the vibration device.

DESCRIPTION OF EMBODIMENTS

First, a configuration of a vibration device 100 will be described with reference to FIGS. 1 and 2.

Figure 1:
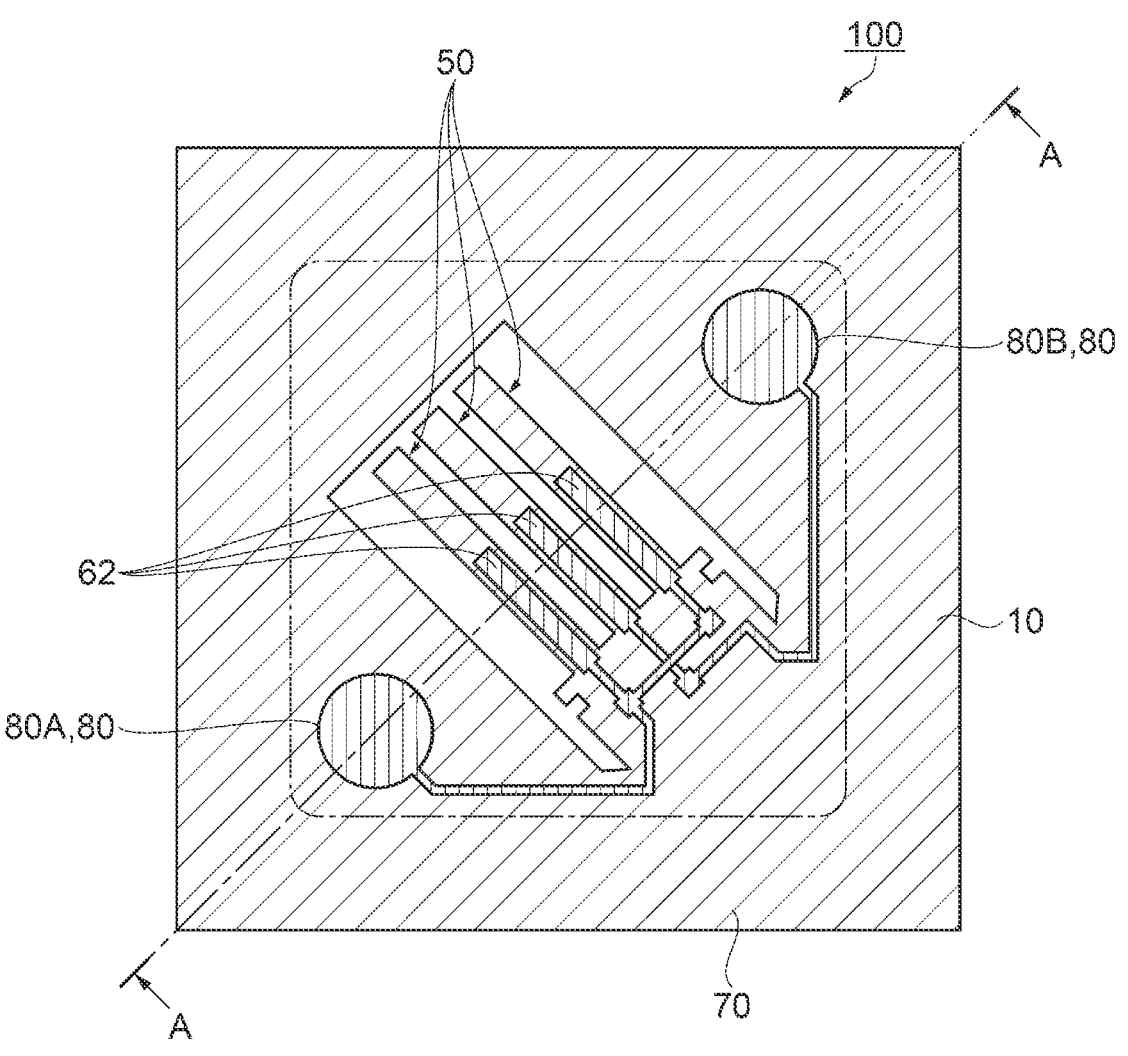
FIG. 1 is a plan view showing a configuration of a vibration device.
Figure 2:
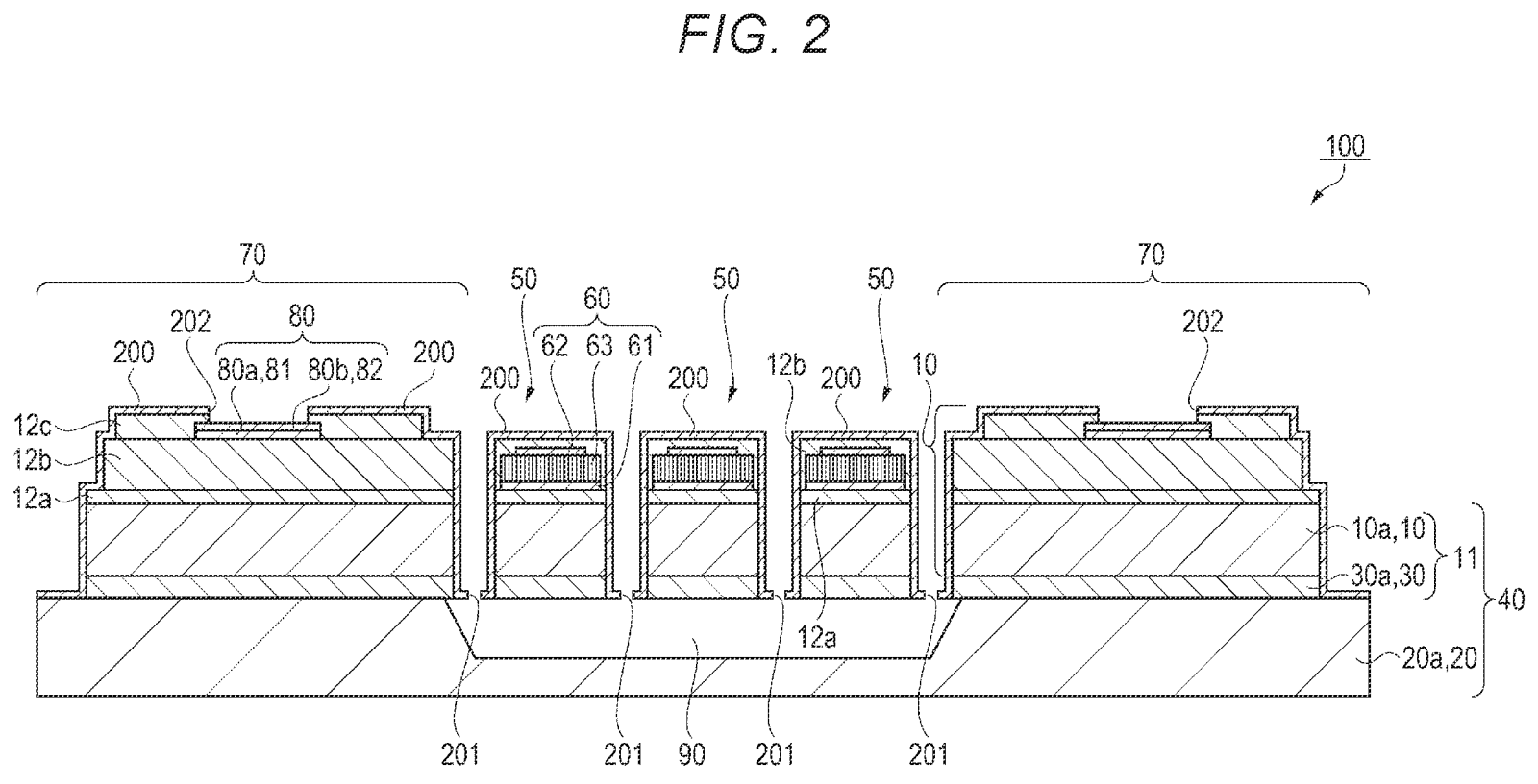

As shown in FIGS. 1 and 2, the vibration device 100 includes an active layer 10 and a support substrate 20 bonded to the active layer 10 on one surface side. Specifically, the vibration device 100 includes a Silicon on Insulator (SOI) substrate 40 including a Buried Oxide (BOX) layer 30 between the active layer 10 and the support substrate 20.

The SOI substrate 40 is a substrate in which a silicon layer 10a, a silicon oxide ($SiO_2$) layer 30a, and a silicon layer 20a are stacked in this order. The silicon layer 10a is made of, for example, single crystal silicon. The active layer 10 includes the silicon layer 10a. The support substrate 20 includes the silicon layer 20a.

The active layer 10 includes elements 50, electrodes 61 and 62 for driving the elements 50, a frame portion 70 disposed around the elements 50, and electrode pads 80 disposed in the frame portion 70 and electrically coupled to the electrodes 61 and 62.

The element 50 includes a base portion 11 including a portion of the silicon oxide layer 30a and a portion of the silicon layer 10a. The element 50 further includes an element adjustment layer 12a, a piezoelectric drive unit 60, an element adjustment layer 12b, and a protective film 200 in order from a base portion 11 side. The vibration device 100 according to the embodiment includes three elements 50.

A space 90 (also referred to as a cavity) that is a region where the elements 50 vibrate is provided between the element 50 and the support substrate 20.

The element adjustment layers 12a and 12b are provided to correct resonance frequency temperature characteristics of the element 50. Silicon has a resonance frequency that decreases as a temperature increases, while a silicon oxide film has a resonance frequency that increases as a temperature increases. Accordingly, the resonance frequency temperature characteristics can be brought close to be flat by disposing the element adjustment layers 12a and 12b made of silicon oxide around the elements 50.

The piezoelectric drive unit 60 includes a first electrode 61, a piezoelectric layer 63, and a second electrode 62. The first electrode 61 and the second electrode 62 are disposed so as to sandwich the piezoelectric layer 63.

A material of the first electrode 61 is, for example, molybdenum (Mo). A material of the piezoelectric layer 63 is, for example, aluminum nitride (AlN). A material of the second electrode 62 is, for example, molybdenum (Mo).

Two electrode pads 80 are disposed in the frame portion 70 on both sides of the elements 50 in a plan view. In the embodiment, the three elements 50 are disposed. In this case, the second electrodes 62 of two elements 50 at two ends are electrically coupled to an electrode pad 80A. The second electrode 62 of the middle element 50 is electrically coupled to an electrode pad 80B. The first electrodes 61 (see FIG. 2) of the three elements 50 are electrically coupled to a same potential.

In the electrode pad 80, for example, a lower electrode pad 81 formed by adding a trace amount of copper (Cu) to aluminum (Al) and an upper electrode pad 82 made of titanium nitride (TiN) are stacked. In this manner, since the upper electrode pad 82 made of titanium nitride is exposed on an upper surface through a second opening portion 202, the lower electrode pad 81 can be prevented from being etched by an etching process for forming the space 90.

When a voltage is applied between the first electrodes 61 and the second electrodes 62 through the two electrode pads 80, the piezoelectric layers 63 expand and contract accordingly, and the adjacent elements 50 vibrate in reversed phases. The vibration is greatly excited at an inherent resonance frequency and an impedance is minimized. As a result, by coupling the elements 50 to an oscillation circuit, an oscillation occurs at an oscillation frequency mainly determined by the resonance frequency of the elements 50.

The protective film 200 is provided to cover the other surface sides of the elements 50 and the frame portion 70 in the vibration device 100. First opening portions 201 are provided in the protective film 200 between outer shapes of the elements 50 and the frame portion 70. The second opening portions 202 are provided in the protective film 200 on the electrode pads 80.

The protective film 200 is made of a material resistant to an etchant. Examples of the material of the protective film 200 include silicon oxide ($SiO_2$). The etchant is, for example, tetramethylammonium hydroxide (TMAH).

Next, a method for manufacturing the vibration device 100 will be described with reference to FIGS. 3 to 8.

Figure 3:
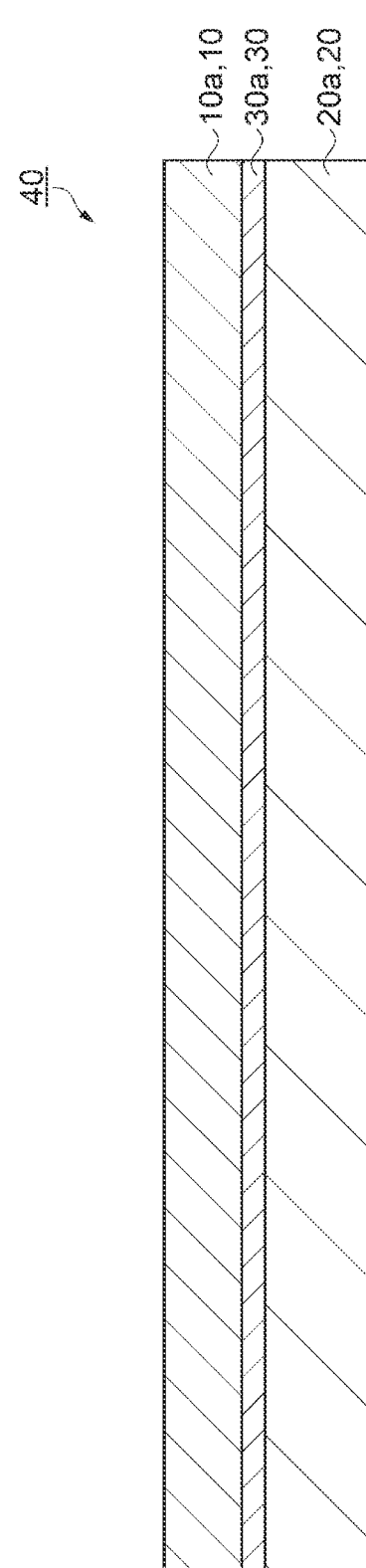
FIG. 3 is a cross-sectional view showing a method for manufacturing the vibration device.

First, in a step shown in FIG. 3, the SOI substrate 40 is prepared in which the silicon layer 10a as the active layer 10, the silicon oxide layer 30a as the BOX layer 30, and the silicon layer 20a as the support substrate 20 are stacked.

A thickness of the active layer 10 is, for example, 5 μm. A thickness of the BOX layer 30 is, for example, 1 μm. A thickness of the support substrate 20 is, for example, 600 μm.

Figure 4:
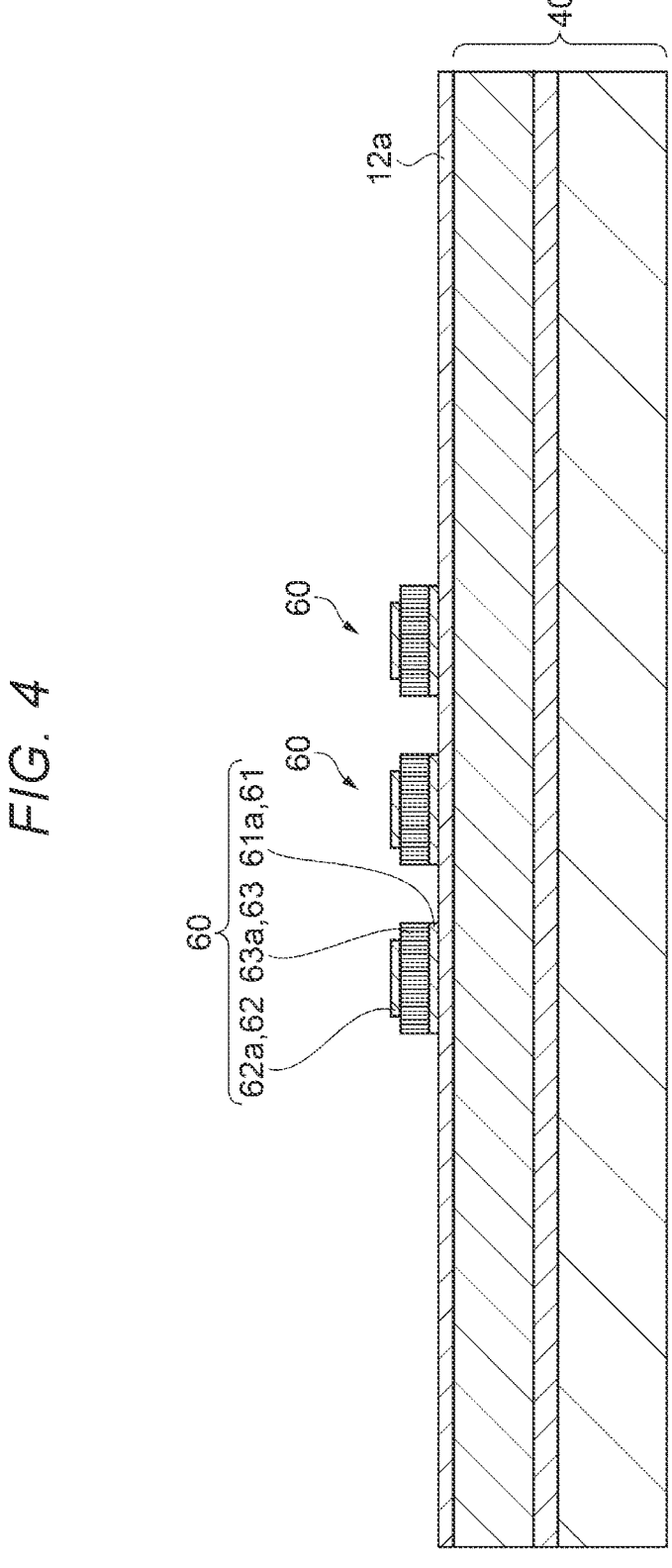
FIG. 4 is a cross-sectional view showing the method for manufacturing the vibration device.

Next, in a step shown in FIG. 4, the piezoelectric drive units 60 are formed on the SOI substrate 40. Specifically, first, the SOI substrate 40 is subjected to a heat treatment to form a thermal oxide film 12a made of silicon oxide having a thickness of about 1 μm on a surface of the SOI substrate 40. A part of the thermal oxide film 12a becomes the element adjustment layer 12a later.

Next, a molybdenum film 61a to be the first electrode 61 is formed to a thickness of 100 nm using, for example, a sputtering device. Thereafter, an aluminum nitride film 63a to be the piezoelectric layer 63 is formed on the molybdenum film 61a to a thickness of 300 nm using, for example, a sputtering device. Next, a molybdenum film 62a to be the second electrode 62 is formed to a thickness of 100 nm using, for example, a sputtering device.

Next, a resist is applied onto the molybdenum film 62a, and the resist is patterned using a photolithography method to form a resist pattern. Thereafter, the second electrode 62 is completely formed by performing an etching process (for example, dry etching) on the molybdenum film 62a using the resist pattern as a mask. Next, the resist pattern is removed, and then the piezoelectric layer 63 and the first electrode 61 are similarly formed by performing the photolithography method and the etching method. Accordingly, the piezoelectric drive units 60 are completely formed.

Figure 5:
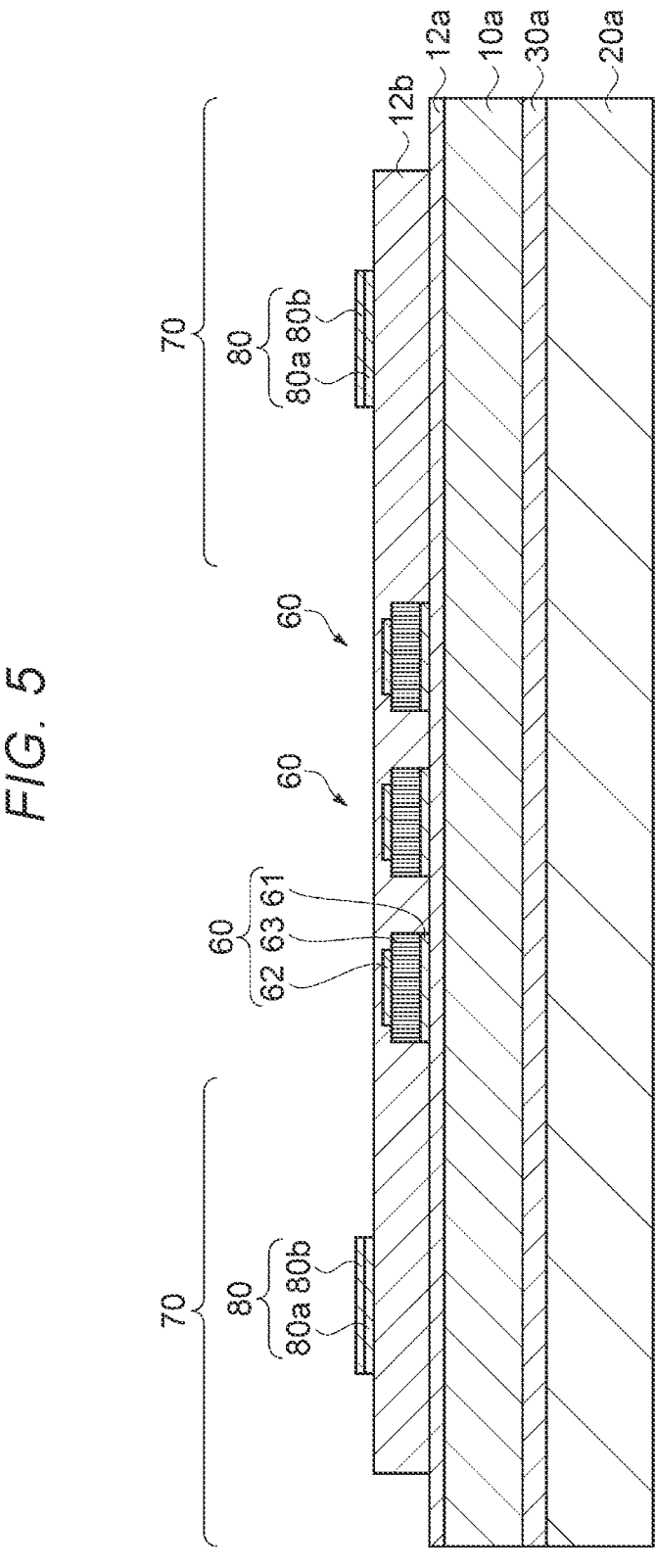
FIG. 5 is a cross-sectional view showing the method for manufacturing the vibration device.

Next, in a step shown in FIG. 5, the electrode pads 80 are formed in a region of the frame portion 70. Specifically, first, a silicon oxide film 12b is formed so as to cover the piezoelectric drive units 60 and the thermal oxide film 12a. As a method for manufacturing the silicon oxide film 12b, for example, a chemical vapor deposition (CVD) method is used. A part of the silicon oxide film 12b becomes the element adjustment layer 12b later.

Next, an aluminum alloy film 80a in which a trace amount of copper (Cu) is added to aluminum (Al) and a titanium nitride (TiN) film 80b, which are to be the electrode pad 80, are formed. A film forming method is implemented by, for example, a sputtering device. A thickness of the aluminum alloy film 80a is, for example, 300 nm. A thickness of the titanium nitride film 80b is, for example, 100 nm. Thereafter, the electrode pads 80 are completely formed by performing the photolithography method and the etching method.

Figure 6:
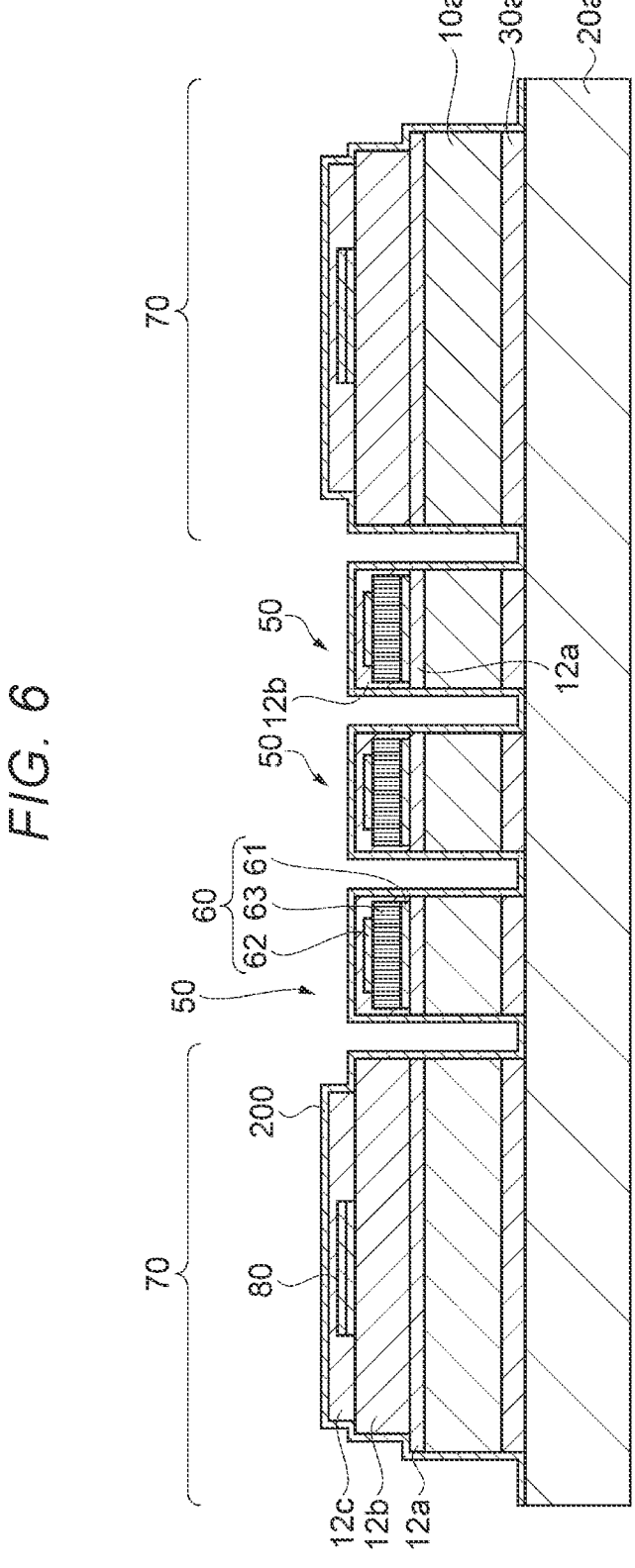
FIG. 6 is a cross-sectional view showing the method for manufacturing the vibration device.

Next, in a step shown in FIG. 6, the protective film 200 is formed around the elements 50 and the frame portion 70. Specifically, first, a silicon oxide film 12c is formed so as to cover the electrode pads 80 and the silicon oxide film 12b. Next, a portion to be the elements 50 is formed to the silicon oxide layer 30a by performing collective dry etching. Thereafter, the protective film 200 resistant to tetramethylammonium hydroxide, which is an etchant, is entirely formed on the other surface sides of the elements 50 and the frame portion 70.

Silicon oxide ($SiO_2$) of the protective film 200 has an etch selectivity to silicon (Si) of 1000 or more. Examples of a method for forming the protective film 200 include a high-density plasma CVD method. A thickness of the protective film 200 is, for example, 500 nm. Accordingly, the protective film 200 is formed on upper surfaces and side walls of the elements 50 and an upper surface and a side wall of the frame portion 70.

Figure 7:
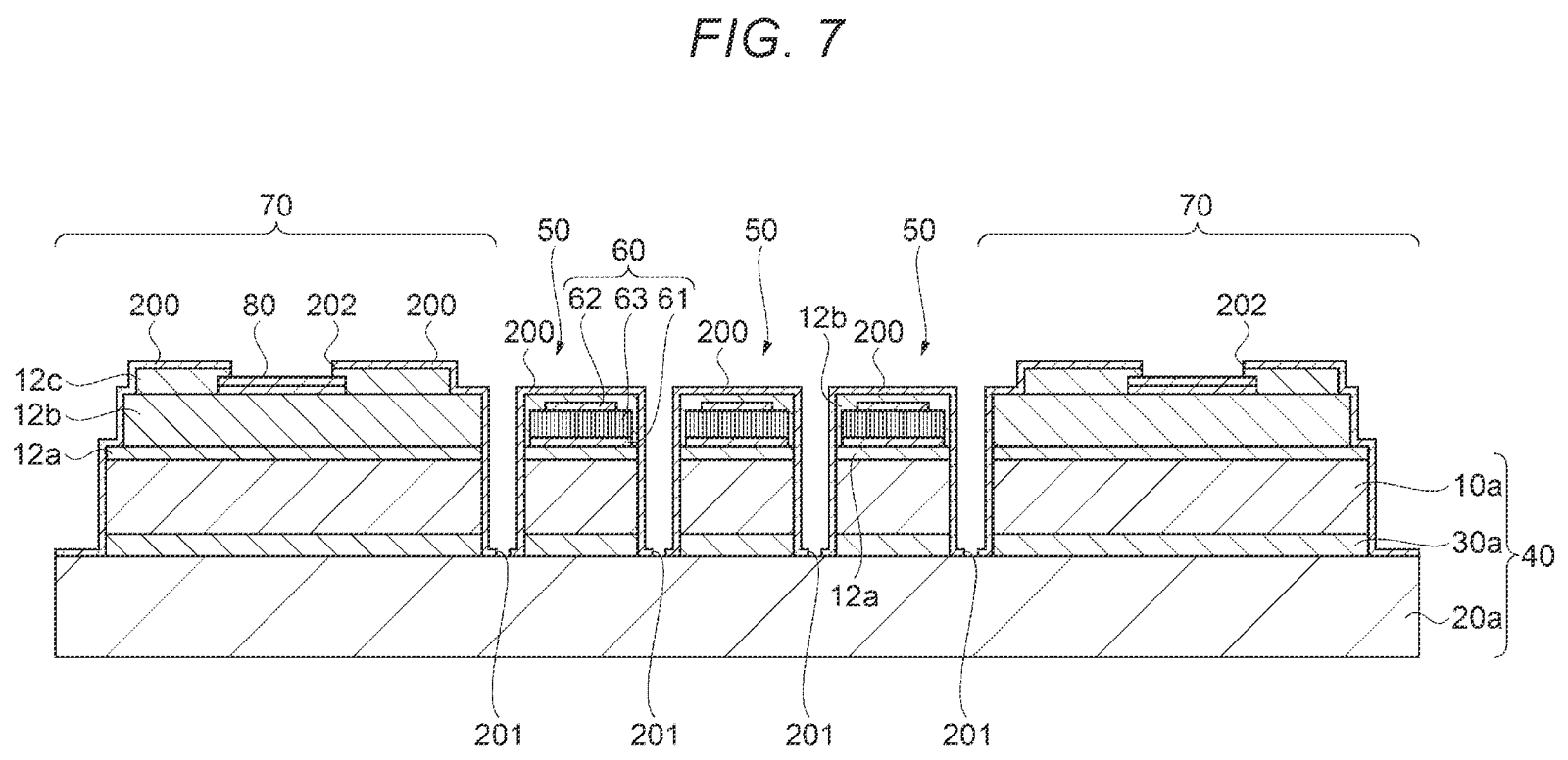

Next, in a step shown in FIG. 7, the first opening portions 201 are formed between the outer shapes of the elements 50 and the frame portion 70, and the second opening portions 202 are formed on the electrode pads 80. The first opening portions 201 and the second opening portions 202 formed in the protective film 200 are simultaneously formed by using the photolithography method and the etching method.

In this case, the first opening portions 201 are on the support substrate 20, and the second opening portions 202 are on the electrode pads 80, which have a step difference of about 7 μm. Therefore, when the photolithography method is used, it is difficult to simultaneously focus on the first opening portion 201 and the second opening portion 202.

However, as compared with formation of the space 90 directly related to vibration characteristics, since dimensional requirement accuracy on the electrode pad 80 is low, a variation in characteristics of the element 50 can be reduced by focusing on and forming the first opening portion 201.

During the dry etching, it is necessary to adjust etching conditions and an over-etch rate such that the etching is stopped at the silicon layer 20a as the support substrate 20 in a portion of the first opening portion 201 and the etching is stopped at the upper electrode pad 82 made of titanium nitride in a portion of the second opening portion 202.

Figure 8:
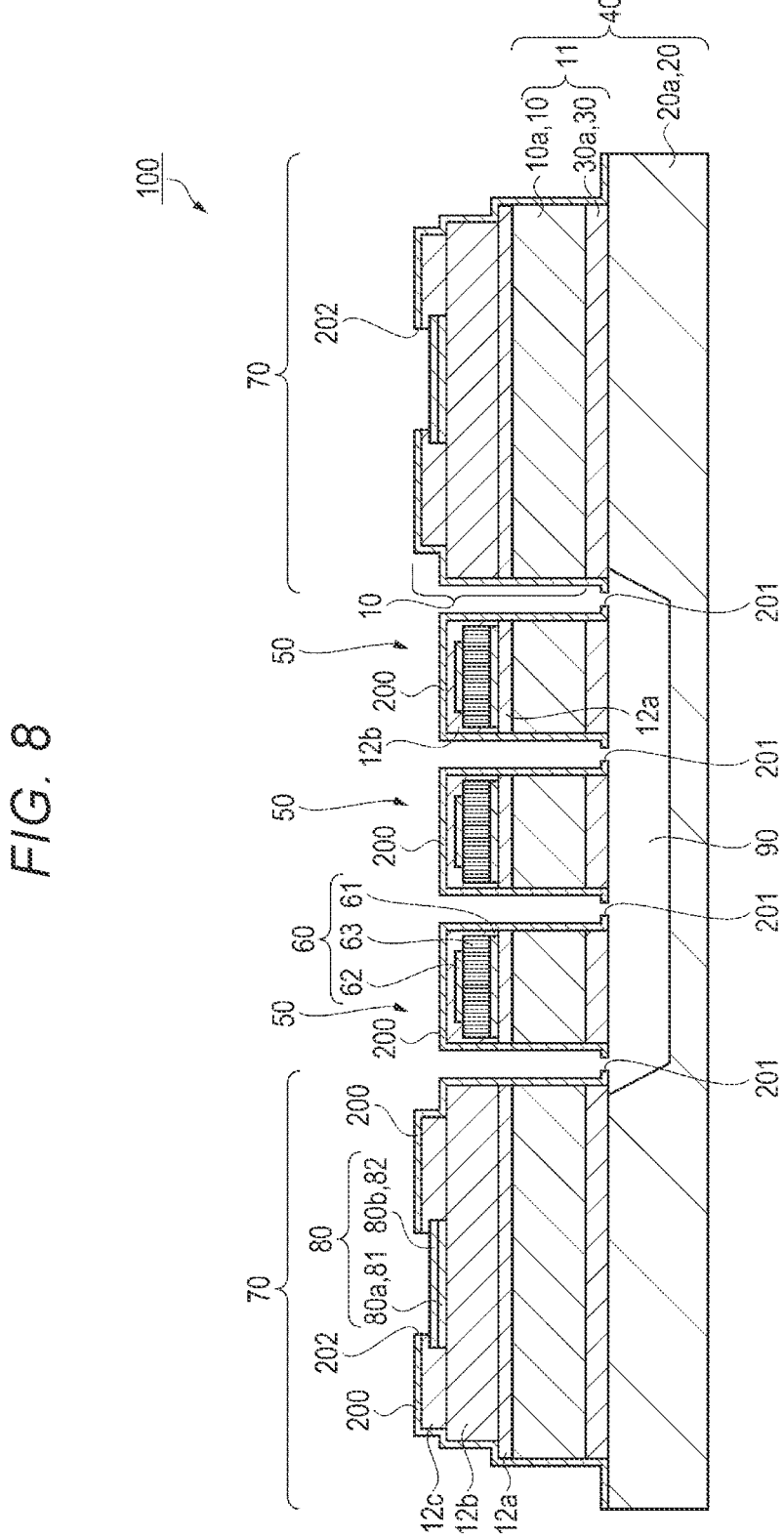
FIG. 8 is a cross-sectional view showing the method for manufacturing the vibration device.

Next, in a step shown in FIG. 8, the support substrate 20 is subjected to an etching process by passing an etchant through the first opening portions 201 to form the space 90 between the elements 50 and the support substrate 20. Specifically, the etchant is tetramethylammonium hydroxide (TMAH) having a concentration of 11%.

The space 90 needs to be etched to a depth at which the elements 50 are not in contact with a bottom portion when vibrating, and has a depth of, for example, 75 μm. Since both the protective film 200 made of silicon oxide and the upper electrode pad 82 made of titanium nitride have an extremely high selectivity to tetramethylammonium hydroxide, the elements 50 can be formed with little abrasion.

By applying an AC voltage to the elements 50 at a specific frequency through the two electrodes 61 and 62, the three elements 50 resonate in a walk mode and operate as a timing device that generates a stable clock.

As described above, the method for manufacturing the vibration device 100 according to the embodiment is the method for manufacturing the vibration device 100 including the active layer 10, which includes the elements 50, the electrodes 61 and 62 for driving the elements 50, the frame portion 70 disposed around the elements 50, and the electrode pads 80 disposed in the frame portion 70 and coupled to the electrodes 61 and 62, and the support substrate 20 bonded to the active layer 10 on one surface side, and includes: forming the protective film 200 at the other surface side of the frame portion 70 and the other surface side of the elements 50, the protective film 200 being resistant to the etchant and including the first opening portions 201 formed between the outer shapes of the elements 50 and the frame portion 70 and the second opening portions 202 formed on the electrode pads 80; and forming the space 90 between the elements 50 and the support substrate 20 by etching the support substrate 20 with the etchant passing through the first opening portions 201.

According to this method, the protective film 200 resistant to the etchant and including the first opening portions 201 and the second opening portions 202 is formed on the other surface side of the frame portion 70 and the other surface side of the elements 50, and then the etching is performed. Therefore, the space 90 can be formed between the elements 50 and the support substrate 20 through the first opening portions 201, and the surfaces of the electrode pads 80 can be exposed through the second opening portions 202. Further, since the elements 50 are prevented from being etched by the protective film 200, the variation in the resonance frequency of the elements 50 can be reduced.

In the method for manufacturing the vibration device 100 according to the embodiment, the upper electrode pad 82 made of titanium nitride is preferably disposed on the surface of the electrode pad 80 exposed through the second opening portion 202. According to this method, since the upper electrode pad 82 having high resistant to the etchant is exposed through the second opening portion 202, it is possible to prevent damage to the lower electrode pad 81 when the etching is performed.

In the method for manufacturing the vibration device 100 according to the embodiment, the protective film 200 is preferably made of silicon oxide. According to this method, since the protective film 200 is made of silicon oxide, the protective film 200 is resistant to the etchant and the protective film 200 can be used as the elements 50 after the etching is performed.

In the method for manufacturing the vibration device 100 according to the embodiment, it is preferable that the support substrate 20 is a silicon substrate, and the etchant is tetramethylammonium hydroxide. According to this method, since tetramethylammonium hydroxide is used as the etchant, the space 90 can be formed in the silicon substrate in accordance with a crystal orientation of silicon.

In the method for manufacturing the vibration device 100 according to the embodiment, it is preferable that the method further includes simultaneously forming the first opening portions 201 and the second opening portions 202 after forming the protective film 200. According to this method, since the first opening portions 201 and the second opening portions 202 are formed at the same time, the number of manufacturing steps can be reduced, and the number of steps can be reduced.

Hereinafter, a modification of the above-described embodiment will be described.

As described above, the configuration of the vibration device 100 having the three elements 50 has been described as a MEMS device, but the present disclosure is not limited thereto. The MEMS device can be applied to a tuning fork type vibration element including two elements 50, an angular velocity sensor element, an acceleration sensor element, a pressure sensor element, and the like. In addition, examples thereof include an ultrasonic sensor using a piezoelectric film, and a resonator used in a timing device.

What is claimed is:

1. A method for manufacturing a vibration device in which a frame portion, an element substrate including a plurality of beam-shaped elements disposed in a cavity inside the frame portion and extending from an inside of the frame portion, a buried oxide (BOX) layer, and a support substrate are laminated in this order, a piezoelectric drive unit is laminated on a surface of the plurality of beam-shaped elements opposite the BOX layer, and a first electrode pad and a second electrode pad are laminated on a surface of the frame portion opposite the BOX layer, the method comprising:

forming the piezoelectric drive unit by laminating a first element electrode, a piezoelectric layer, and a second element electrode in this order on the surface of the beam-shaped elements opposite the BOX layer;

forming a protective film that is resistant to an etchant on the frame portion and on the piezoelectric drive unit of the plurality of beam-shaped elements so as to form a first opening portion between an outer shape of the plurality of beam-shaped elements and the frame portion, and to form second opening portions over the first electrode pad and the second electrode pad;

forming a space between the plurality of beam-shaped elements and the support substrate by etching the support substrate with the etchant that passes through the first opening portion; and disposing titanium nitride on the surfaces of the first electrode pad and the second electrode pad exposed from the second opening portions, wherein the first electrode pad is connected to the first element electrode, the second electrode pad is connected to the second element electrode, and adjacent elements amount the plurality of beam-shaped elements vibrate in reversed phases.

2. The method for manufacturing a vibration device according to claim 1, wherein the protective film is made of silicon oxide.

3. The method for manufacturing a vibration device according to claim 1, wherein the support substrate is a silicon substrate, and the etchant is tetramethylammonium hydroxide.

4. The method for manufacturing a vibration device according to claim 1, further comprising:

simultaneously forming the first opening portion and the second opening portion after forming the protective film.

* * * * *